United States Patent
Ware et al.

(10) Patent No.: US 10,511,276 B1
(45) Date of Patent: Dec. 17, 2019

(54) DOMAIN-DISTRIBUTED CRYOGENIC SIGNALING AMPLIFIER

(71) Applicant: Rambus Inc., Sunnyvale, CA (US)

(72) Inventors: Frederick A. Ware, Los Altos Hills, CA (US); Carl W. Werner, Los Gatos, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/043,754

(22) Filed: Jul. 24, 2018

Related U.S. Application Data (60) Provisional application No. 62/536,456, filed on Jul. 24, 2017.

(51) Int. Cl.
*H03F 1/02* (2006.01)
*H03F 1/30* (2006.01)
*H03F 3/16* (2006.01)
*H03F 19/00* (2006.01)
*G06N 10/00* (2019.01)

(52) U.S. Cl.
CPC .......... *H03F 19/00* (2013.01); *H03F 1/0205* (2013.01); *H03F 1/301* (2013.01); *H03F 3/16* (2013.01); *G06N 10/00* (2019.01); *H03F 2200/447* (2013.01)

(58) Field of Classification Search
USPC ................. 330/289, 307, 256, 266, 272
See application file for complete search history.

(56) References Cited

U.S. PATENT DOCUMENTS 7,911,265 B2 * 3/2011 Dzurak ............... H03K 3/38
327/527

OTHER PUBLICATIONS

Deepnarayan Gupta et al. ,"Low-Power High-Speed Hybrid Temperature Heterogeneous Technology Digital Data Link", IEEE Transactions on Applied Superconductivity, vol. 23, No. 3, Jun. 2013.
Prasana Ravindran et al., "Power-Optimized Temperature-Distributed Digital Data Link" IEEE Transactions on Applied Superconductivity, vol. 25, No. 3, Jun. 2015.

* cited by examiner

*Primary Examiner* — Hieu P Nguyen
(74) *Attorney, Agent, or Firm* — Charles Shemwell (57) ABSTRACT

A signal amplifier is distributed between first and second IC devices and includes a low-power input stage disposed within the first IC device, a bias-current source disposed within the second IC device and an output stage disposed within the second IC device. The output stage includes a resistance disposed within the second IC device and having a first terminal coupled to a drain terminal of a transistor within the input stage via a first signaling line that extends between the first and second IC devices.

21 Claims, 5 Drawing Sheets

FIG. 1 Inter-Domain Signaling System with Domain-Distributed Amplifier

DOMAIN-DISTRIBUTED CRYOGENIC SIGNALING AMPLIFIER

CROSS REFERENCE TO RELATED APPLICATIONS

This application hereby claims priority to and incorporates by reference U.S. provisional application No. 62/536,456 filed Jul. 24, 2017.

TECHNICAL FIELD

The present disclosure relates to signaling between integrated circuit devices.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments herein, signaling amplifier components are distributed between source and destination ICs (integrated circuit devices or chips) in different cryogenic temperature domains. In a number of embodiments, a low-power input stage component of an amplifier is implemented in a transmitting (signal source) IC disposed in a cryogenic temperature domain sufficiently cold to enable superconduction through Josephson junction stacks and/or operation of rapid single-flux quantum (RSFQ) circuits, while higher power biasing and output stage components of that same amplifier are implemented in a receiving (signal destination) IC device disposed in a substantially warmer (though possibly still cryogenic) temperature domain (cryogenic temperatures being, for example, temperatures below 93.15 K per U.S. National Institute of Standards and Technology, or, as occasionally defined, temperatures below 123 K). Although the source and destination ICs may implement virtually any core function, in particular embodiments the source IC implements a memory control function as in the case of a dedicated memory controller component or processor component (e.g., CPU) having a memory control function, while the destination IC implements a data storage function and/or signal buffering function as in the case of a memory component or buffer component, where the buffer component serves as an intermediary between the memory control/CPU component and one or more memory components. Although this source/destination terminology is carried forward in detailed embodiments presented below, in all cases, the destination IC may also transmit signals to the source IC, including transmitting signals to the source IC over the same signaling link(s) driven by the source IC (i.e., bidirectionally-driven signaling link(s)), and/or transmitting signals to the source IC via one or more dedicated (unidirectionally-driven) signaling link(s). For example, a source memory-control IC (e.g., CPU or dedicated memory controller) that transmits writes write data and/or control signals to a destination memory IC may also receive read data signals and/or status information transmitted by the memory IC.

Figure 1:
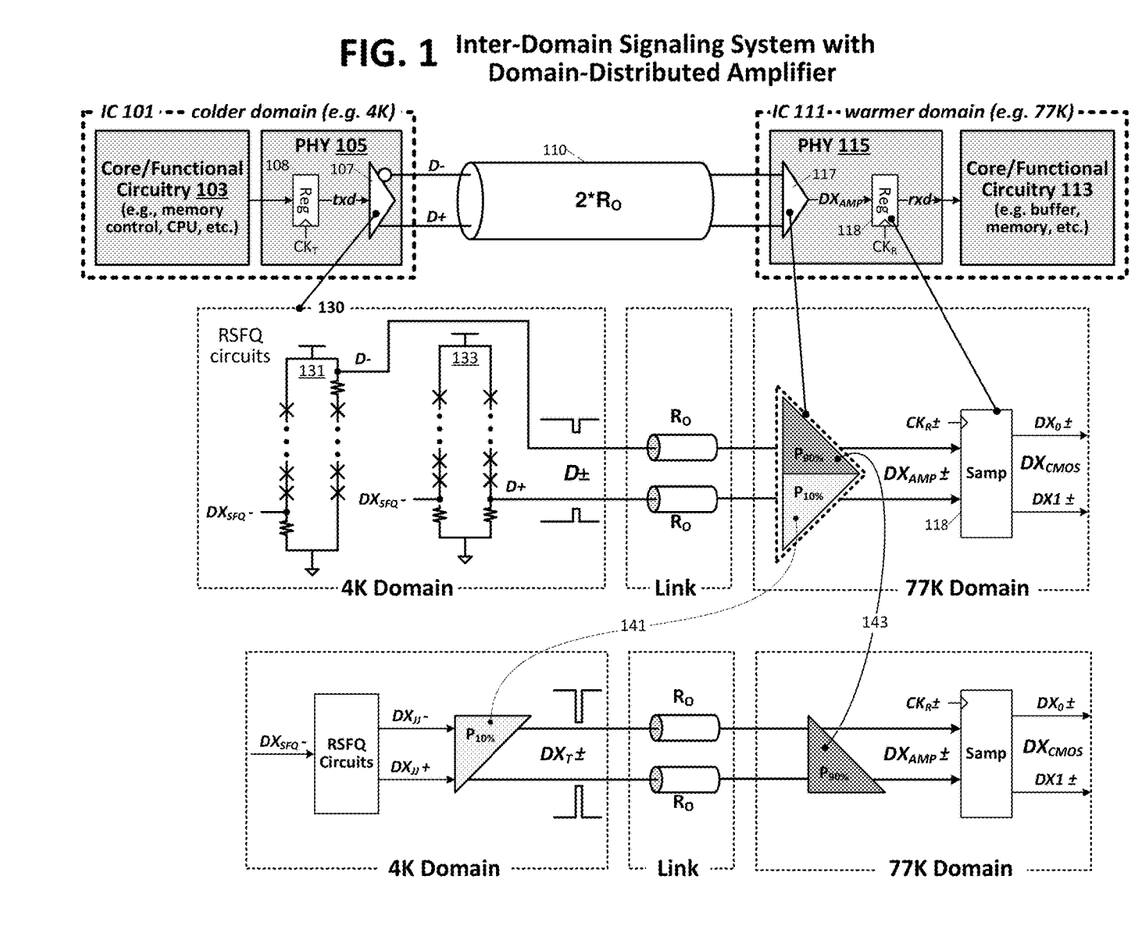
FIG. 1 illustrates an embodiment of a chip-to-chip signaling system in which a multi-conductor signaling link is coupled between IC devices disposed in relatively cold and warm temperature domains.

FIG. 1 illustrates an embodiment of a chip-to-chip signaling system 100 in which multi-conductor signaling link 110 is coupled between IC devices 101 and 111 disposed in relatively cold and warm temperature domains, respectively. More specifically, the cold-domain IC or "cold chip" 101 resides in a cryogenic domain cold enough to permit operation of superconducting circuit components (e.g., 4 Kelvin (4 K), though lower or higher temperatures may apply in other embodiments), while the warm-domain IC 111 ("warm chip") resides in a warmer, but still cryogenic, 77 K environment (again, lower or higher temperatures may apply). As shown, cold chip 101 includes core circuitry 103 (i.e., to implement the core functions of the component, be they memory control, processing, etc.) together with physical signaling circuitry (PHY 105), both of which may be implemented predominantly by extremely low-power RSFQ circuit elements—an implementation that avoids the energy inefficiencies attendant in more conventional transistor-based circuitry. Warm chip 111 also includes core functional circuitry 113 (memory cell array, buffer, etc.) together with a PHY 115, but in a predominantly transistor-based implementation—for example in CMOS (complementary metal oxide semiconductor) circuitry.

While each of the PHYs within ICs 101 and 111 generally includes multiple transmitters and receivers (and/or transceivers) coupled to respective signaling links, PHYs 105 and 115 are depicted for purposes of explanation as minimally containing a synchronous differential transmitter and counterpart synchronous differential receiver, respectively. More specifically, on the transmit side (i.e., within cold chip 101), an RSFQ register element 108 is clocked by a transmit timing signal, $CK_T$ (e.g., a "transmit clock" though a strobe signal may be employed instead), to deliver a stream of transmit data values to differential output driver 107 during a corresponding sequence of bit-time intervals (also referred to herein as unit intervals or bit intervals). More specifically, in one embodiment, the output of the RSFQ register is either a pulse or absence of a pulse within the corresponding bit interval (i.e., conveying logic '1' and '0' bit values, respectively, or logic '0' and '1' bit values) which, due to the quantum nature of the pulse (i.e., a ~2.1 mV-picosecond pulse–h/2e, a magnetic flux quantum), is split into two or more identical outputs to drive respective driver branches within differential output driver 107. Output driver 107 responds to the incoming quantum pulse stream by driving, during each bit interval, a differential voltage or pseudo-differential voltage D±onto the component conductors of signaling link 110 with a voltage swing (difference between more positive and more negative voltage levels) and duration sufficient to enable data bit recovery within transistor-based PHY 115. In the depicted embodiment, receive-side PHY 115 includes transistor signal amplifier 117 (CMOS amplifier, though not limited to such) that amplifies the incoming differential signal (yielding amplified signal $DX_{AMP}$) to be sampled and latched within sampling element 118 in response to respective transitions of a receive timing signal, $CK_R$. Note that while multi-conductor signaling link 110 is occasionally referred to herein as a differential signaling link, such terminology is intended to encompass conveyance of differential and pseudo-differential signals thereon.

When output driver 107 is implemented entirely by RSFQ circuits as shown at 130, disparately configured stacks of Josephson junctions 131, 133 ("driver branches") respond to respective instances of the incoming transmit data value, $DX_{SFQ}$–(i.e., presence or absence of a quantum pulse), by generating a relatively high or relatively low voltage (or vice-versa) at a respective one of transmitter output nodes D+ and D−. More specifically, if the transmit data value ($DX_{SFQ}$−) supplied by register 108 is a logic '1' as signified in complementary form by absence of a quantum pulse for the subject bit interval, driver branch 131 drives a relatively high voltage level at D+ while driver branch 133 drives a relatively low voltage level at D−, thus transmitting a logic '1' voltage differential onto the differential signaling link—a transmission line in this case perceived by the transmitter as having an $R_O$ (or $Z_O$) impedance on each conductor. Conversely, if the transmit data value is a logic 0, signified in complementary form by presence of a quantum pulse during the subject bit interval, D+ driver branch 131 drives a relatively low voltage level while D− driver branch 133 drives a relatively high voltage level to transmit a logic '0' voltage differential onto signaling link 110. In either case, the resulting differential data eye (i.e., information bearing signal having an "eye width" duration and "eye height" differential amplitude) propagates across signaling link 110 to arrive at input nodes of CMOS signal amplifier 117.

While the RSFQ transmitter and receiver-side amplifier may be sufficient in some signaling applications, the relatively low signal levels produced at the outputs of driver branches 131 and 133 (and/or complexity of implementing the depicted Josephson-junction stacks) may present signal integrity issues (e.g., high error rates) in noisier environments and/or applications requiring longer signaling distances. On the other hand, simply moving CMOS amplifier 117 to the transmit-side 4K domain inflicts a substantial penalty as the power required to dissipate amplifier thermal losses is approximately 20× the amplifier power consumption—roughly 4 mW per signaling link in the case of a ~200 uW CMOS amplifier, with such links numbering in the tens, hundreds, thousands or more in high-bandwidth multi-core quantum computing applications.

Observing that CMOS amplifier 117 includes a relatively low-power input stage component and relatively high-power bias and output-drive components, in a number of embodiments detailed below, the signal amplifier is split between the two cryogenic temperature domains, implementing the relatively low-power input stage component within the 4K domain as shown at 141, while leaving the relatively high-power bias component and output-drive component in the warmer 77K domain as shown at 143. Through this arrangement, a CMOS-amplified signal, $DX_1±$, is driven onto the signaling link by the 4K-domain circuitry, while the predominant share of total amplifier power dissipation occurs in the warmer 77K-domain circuitry. In the example shown, for instance, approximately 90% of the amplifier power is dissipated in the 77K domain, versus 10% power dissipation in the 4K domain—an arrangement that reduces the 4K-domain power penalty by a factor of 10 relative to wholesale relocation of the CMOS amplifier to the colder domain.

Figure 2:
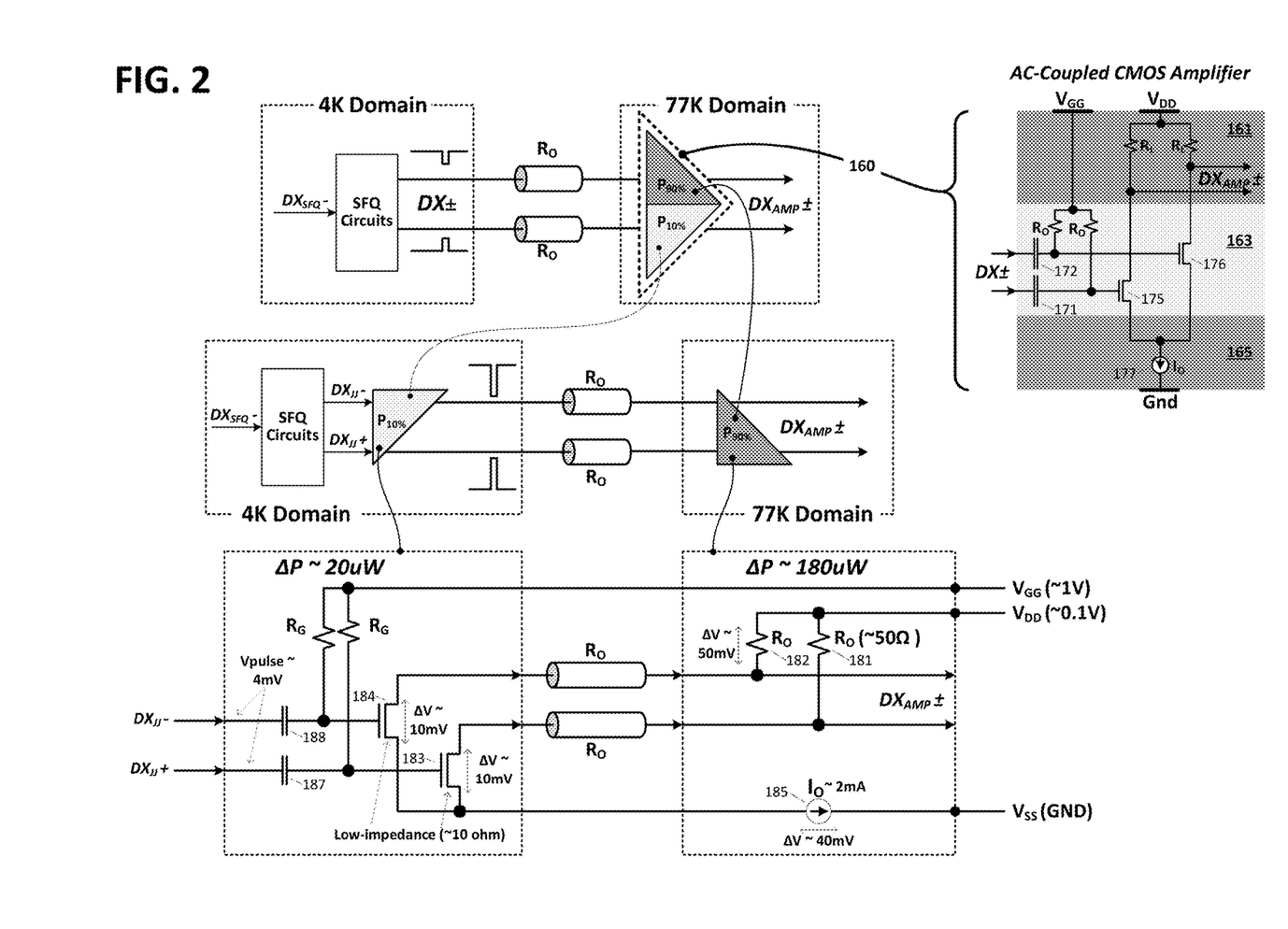
FIG. 2 illustrates a more detailed view of input-stage, common-source bias and output-drive components of an AC-coupled complementary metal oxide semiconductor (complementary MOS or CMOS) amplifier and the distribution of those components within disparate cryogenic temperature domains on opposite sides of a signaling link.

FIG. 2 illustrates a more detailed view of input-stage, common-source bias and output-drive components of an AC-coupled CMOS amplifier and the distribution of those components within disparate cryogenic temperature domains on opposite sides of a signaling link. Referring first to a single-domain amplifier implementation shown at 160, an incoming small-swing differential signal is ac-coupled (via capacitive elements 171, 172) to an amplifier input stage formed by gates of n-MOS transistors 175 and 176. Resistive elements $R_O$, also forming part of the amplifier input stage, are coupled between a gate bias voltage source $V_{GG}$ and respective gates of transistors 175 and 176 and serve both to bias the gates of transistors 175 and 176 at a desired DC-bias point ($V_{GG}$) and also to terminate the differential signaling link (i.e., nominally matching the link impedance). Current-source 177 is coupled between the common (interconnected) source terminals of transistors 175, 176 and ground and effectively establishes the transistor bias point, raising the source voltage ($V_S$) of each transistor to a level (and thereby establishing a gate-to-source bias voltage $V_{GS}$) that, in the absence of a differential input signal, will yield a balanced drain-to-source current ($I_{DS}$) of $I_O/2$ through each of transistors 175 and 176. Pull-up resistors $R_L$ are coupled between respective drains of transistors 175 and 176—the differential output nodes of the amplifier—and supply voltage, $V_{DD}$. When the incoming DX±signal components diverge to differential levels (i.e., to convey a data value), the high-going signal component will increase the small-signal gate-to-source voltage within the corresponding one of transistors 175 or 176, while the low-going component will produce the opposite effect (current decrease) within the other of those transistors, resulting in increased $I_{DS}$ and thus reduced output voltage (due to the increased voltage drop across the corresponding $R_L$ pull-up resistor) in one of the differential output nodes, and reduced $I_{DS}$/increased output voltage in the other of the output nodes. The bias points established by the $V_{GG}$ potential and common-source bias current ($I_O$), and the amplifier gain established by the bias point and pull-up resistance values may vary according to application needs, but are generally chosen to yield a signal level that enables downstream CMOS sample and latch operation within a constrained power budget.

Still referring to FIG. 2, by relocating the relatively low power input stage components to the transmit-side of signaling link (4K domain), while leaving the relatively higher power transistor-bias current source and output-drive stage (pull-up) resistors in the 77K receive-side of the link, transmit-side signal amplification is achieved while maintaining the predominant amplifier power dissipation within the warmer 77K domain. In the specific example shown, pull-up resistors 181 and 182 (which now serve as link termination elements and are thus set to $R_O$) are set to approximately 50 ohms, $V_{GG}$ is set to approximately one volt, $V_{DD}$ is set to approximately 100 mV and transistor/common-source bias current $I_O$ is set to approximately 2 mA—set points at which approximately 50 mV is dropped across each pull-up resistor (50 uW of power each), 10 mV is dropped across each of transistors 183 and 184 (10 uW of power each) and 40 mV is dropped across current source 185 (80 uW). Thus, of the ~200 uW dissipated within the amplifier, only 20 uW (10%) is dissipated in the 4K domain, while 180 uW (90%) is dissipated within the warmer 77K domain, a vastly improved thermal result as compared with full amplifier instantiation within the 4K domain while retaining the signaling benefits of transmit-side amplification. Note that the bias points established by the bias-current source and gate bias voltage, and/or the amplification level established by the $V_{DD}$ setpoint (in relation to the transistor bias point and the link-matched pull-up resistance elements) may vary in alternative embodiments through programmable adjustment (e.g., programmable current source) or design change. AC-coupling capacitors 187 and 188 may be sized similarly to those depicted at 171, 172 with implementation change as necessary to accommodate operation at 4 K.

Figure 3:
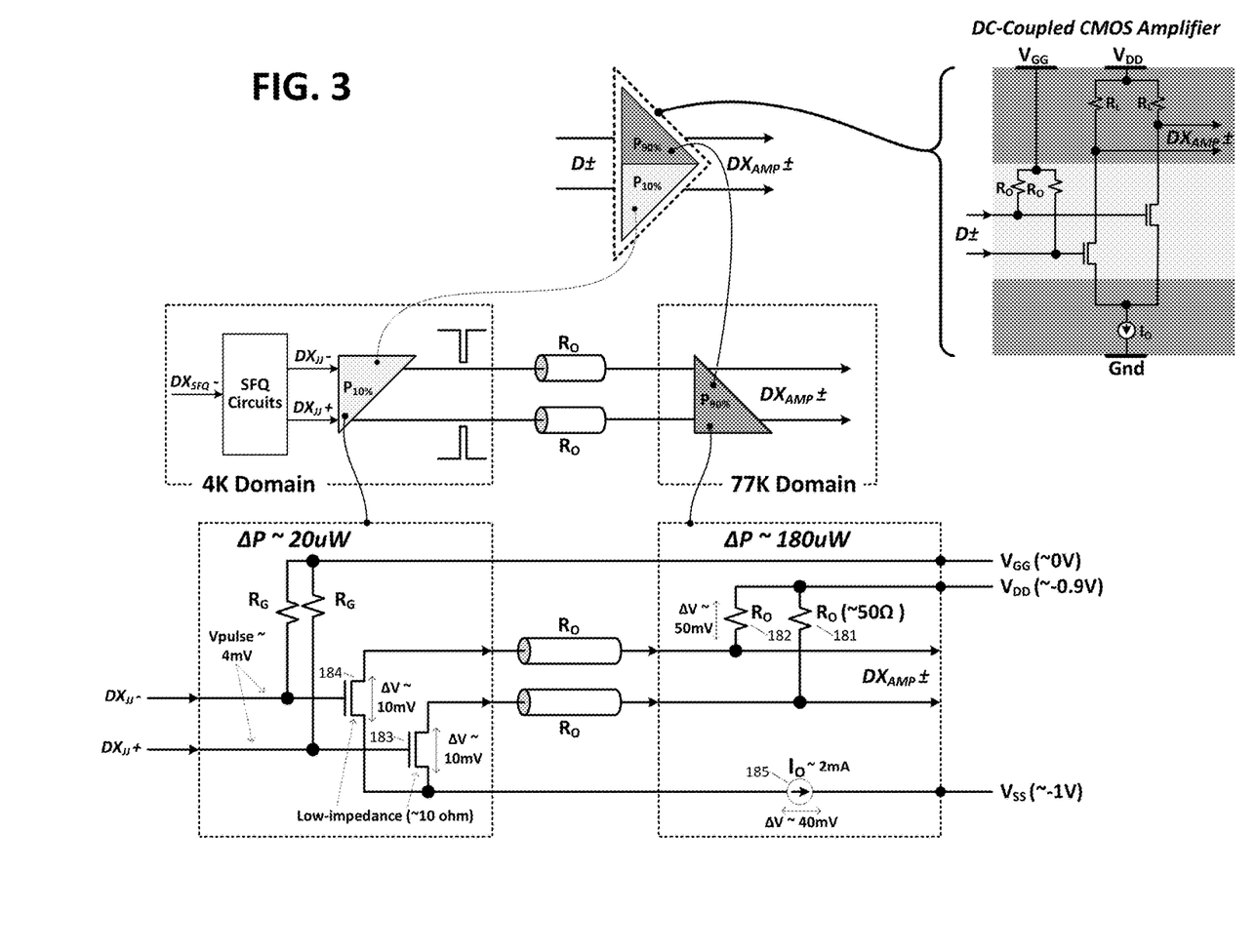
FIG. 3 illustrates an alternative domain-distributed amplifier arrangement in which an RSFQ-sourced signal is coupled directly (instead of through capacitive elements) to gates of input-stage transistors.

FIG. 3 illustrates an alternative domain-distributed amplifier arrangement in which the RSFQ-sourced signal is coupled directly (instead of through capacitive elements 187, 188 as shown in FIG. 2) to gates of input-stage transistors 183 and 184. In this case, the gate bias voltage is lowered to the common-mode potential of the RSFQ output—from one volt to zero volts in the specific example shown—and the $V_{DD}$ and $V_{SS}$ voltage potentials are correspondingly lowered (i.e., from 100 mV to −900 mV and from 0V to −1V, respectively). The resistance values and current source setting are unchanged from those shown in the AC-coupled embodiment of FIG. 2, so that the voltage drops across transistors 183 and 184, current-source 185 and pull-up/termination resistances 181 and 182 are also unchanged. Consequently, the power dissipation split remains at 10% 4K domain and 90% 77K domain as desired.

Figure 4:
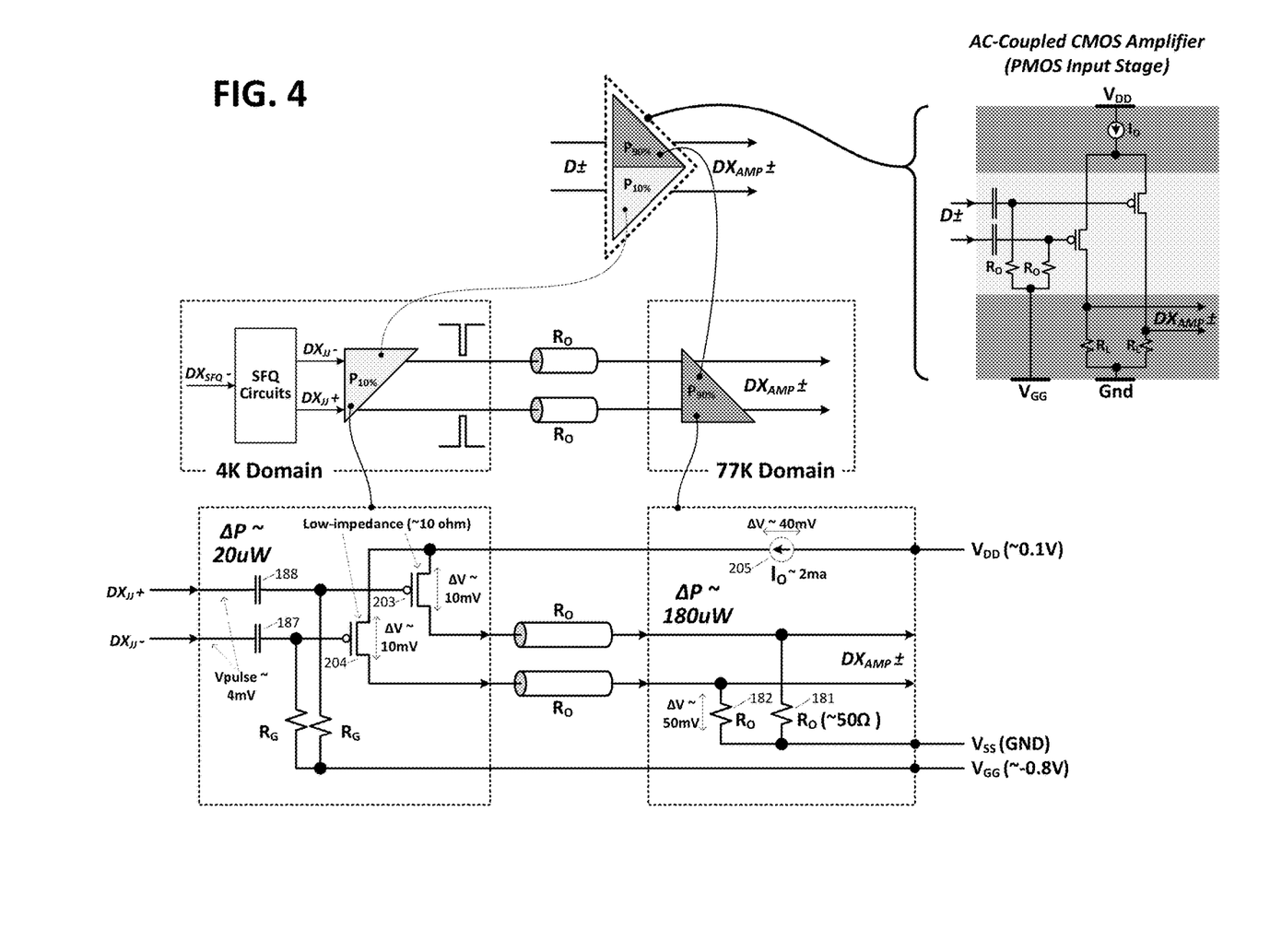
FIG. 4 illustrates an alternative embodiment of an AC-coupled domain-distributed amplifier implemented with p-MOS transistors instead of n-MOS devices.

FIG. 4 illustrates an alternative embodiment of an AC-coupled domain-distributed amplifier implemented with p-MOS transistors 203 and 204 instead of n-MOS devices and thus with transistor sources coupled in common to $V_{DD}$ via biasing current source 205, output-stage/termination resistors 181, 182 being coupled between transistor drains and ground (effecting a pull-down configuration), and gate bias resistors $R_G$ being coupled to a potential well below $V_{DD}$ (i.e., $V_{GG}$=−800 mV in the depicted example) to establish the desired −$V_{GS}$ bias point. $V_{DD}$ and $V_{SS}$ are set to to 100 mV and ground, respectively, and the bias current and pull-down resistance values ($I_O$, $R_O$) match those in the embodiments shown in FIGS. 2 and 3 so that the power dissipation split remains, as in those cases, at 10% 4K, 90% 77K.

Figure 5:
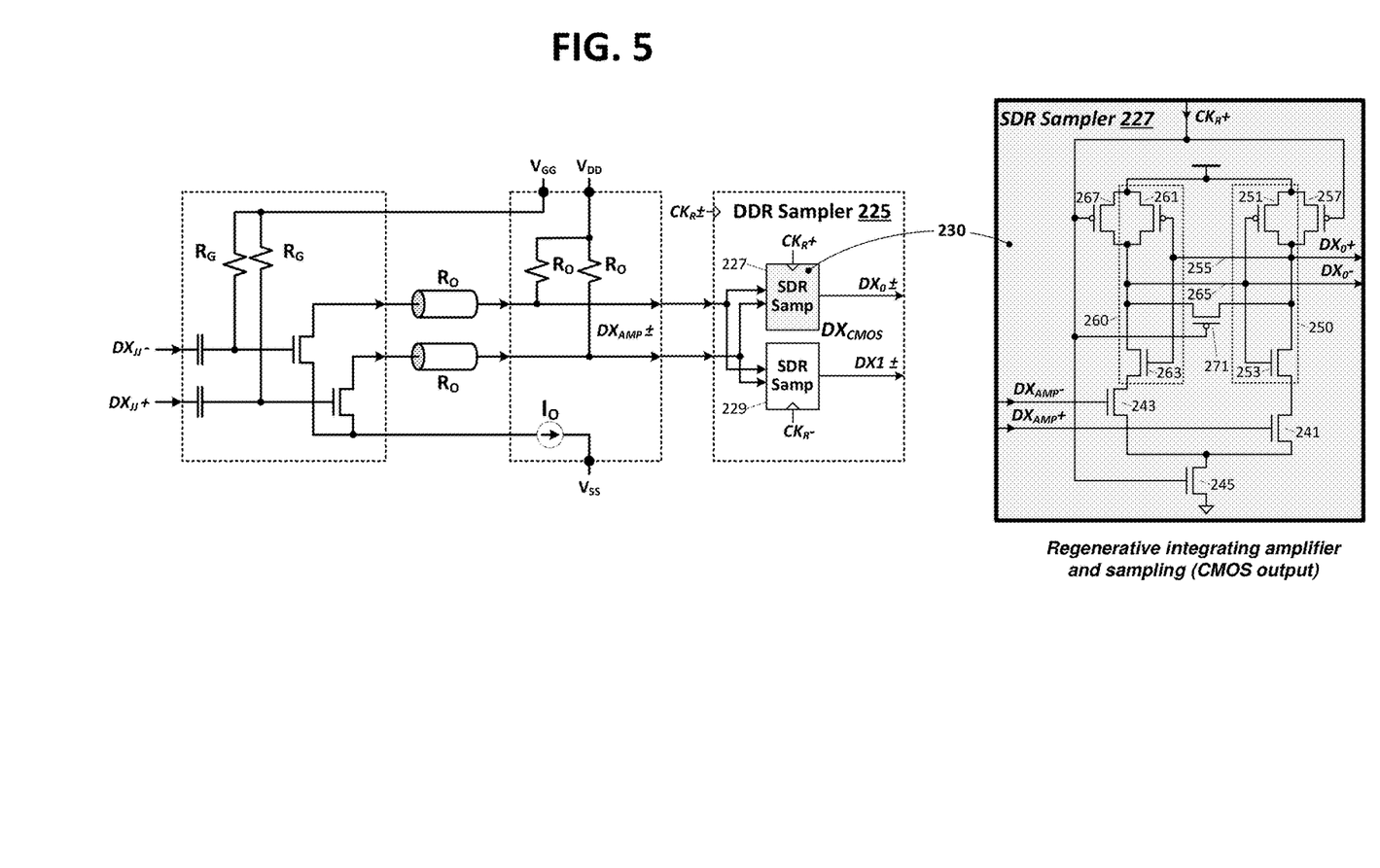
FIG. 5 illustrates an embodiment of a double-data-rate (DDR) sampling circuit coupled to receive the output of a domain-distributed signal amplifier.

FIG. 5 illustrates an embodiment of a double-data-rate (DDR) sampling circuit 225 coupled to receive the output of a split-domain signal amplifier—in this instance, the AC-coupled split-domain amplifier depicted in FIG. 2. As shown, DDR sampler (which may be used to implement sampler 118 of FIG. 1) includes even-phase and odd-phase sample circuits 227 and 229, each coupled to receive the split-amplified differential data signal, $DX_{AMP}±$. Even-phase sampler 227 samples the incoming signal during even phases of the receive clock signal and thus in response to $CK_R+$, while odd-phase sampler 229 samples the input signal during odd phases of the receive clock signal (in response to $CK_{R-}$), each of samplers 227 and 229 latching one bit per clock cycle so that, as a whole, DDR sampler 225 captures (samples and latches) two bits per receive clock cycle.

In the FIG. 5 embodiment, even-phase and odd-phase samplers 227 and 229 are identically implemented by respective single-data-rate (SDR—capturing one bit per clock cycle) sample/latch circuits with the even-phase implementation shown in detail view 230. Transistors 241 and 243 (n-MOS devices) receive complementary components of the incoming differential signal at their respective gate terminals and are coupled in a common-source configuration with sample-enable transistor 245 (also n-MOS) coupled between the sources of transistors 241/243 and ground. Drain-interconnected p-MOS/n-MOS transistors 251/253 and 261/263 form respective inverters 250 and 260 coupled back-to-back (input of inverter 250 coupled to output of inverter 260 and vice-versa) to form a latch, with respective output nodes of those inverters (255, 265) forming the differential output of sampler 227. Precharge transistors 257 and 267 (p-MOS devices) are coupled source-to-drain between $V_{DD}$ and the outputs of inverters 250 and 260, respectively, with gate terminals coupled to receive the incoming clock signal, $CK_R+$. Equalizing transistor 271 (also a p-MOS device) is coupled drain-to-source between the outputs of inverters 250 and 260 (and thus between their inputs as well) also with gate terminal coupled to receive $CK_R+$, and the gate terminal of sample-enable transistor 245 is coupled to receive $CK_R+$ as well. In this configuration, the low-phase of $CK_R+$ switches off sample-enable transistor 245, floating the sources of input-stage transistors 241/243 and thus the sources of n-MOS transistors 253 and 263 within respective inverters 250 and 260. The low-phase of $CK_R+$ also switches on precharge transistors 257 and 267 and equalizing transistor 271, precharging the inputs and outputs of inverters 250 and 260 to $V_{DD}$ in preparation for a sampling operation during the ensuing high-phase of $CK_R+$. When $CK_R+$ goes high (switching on sample-enable transistor 245 and switching off transistors 257, 267 and 271), the differential input level at the gates of transistors 241 and 243 yields a relatively lower potential at the source of one of n-MOS transistors 241/243 than the other, powering on one of inverters 250, 260 before or more significantly the other so that the first-powered inverter (250 or 260) drives a low output in response to the precharged high input. Due to their back-to-back coupling, the low output of the first-powered inverter drives the input of other of inverters 250, 260 low to reinforce the high output from that other inverter and the low output from the first-powered inverter—snapping inverters 250 and 260 into a latched condition with one of inverters 250/260 driving a CMOS-high output and the other driving a CMOS-low output—a differential CMOS output signal—according to the state of the input differential signal, $DX_{AMP}±$. Odd-phase SDR sampler 229 operates in the same manner to precharge during the low phase of $CK_{R-}$ (while a sample and latch operation is being carried out in SDR sampler 227) and to sample and latch the $DX_{AMP}±$ signal during the high phase of $CK_{R-}$ (while SDR sampler 227 is precharging).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, Josephson junction stack sizes or characteristic voltages/currents, signal path widths, signaling or operating frequencies, component circuits or devices and the like can be different from those described above in alternative embodiments. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A signal amplifier distributed between first and second integrated-circuit (IC) devices, the signal amplifier comprising:
   an input stage disposed within the first IC device and having a first transistor coupled to receive a first input signal at a gate terminal thereof;
   a current source disposed within the second IC device and coupled between a first supply voltage node and a source terminal of the first transistor; and
   a first output-stage resistance disposed within the second IC device and having (i) a first terminal coupled to a drain terminal of the first transistor via a first signaling line that extends between the first and second IC devices, and (ii) a second terminal coupled to a second supply voltage node, the first terminal of the first output-stage resistance constituting a first output of the signal amplifier.

2. The signal amplifier of claim 1 wherein the first transistor is a metal oxide semiconductor (MOS) transistor.

3. The signal amplifier of claim 1 wherein the gate terminal of the first transistor is coupled to receive the first input signal from a rapid single flux quantum (RSFQ) circuit.

4. The signal amplifier of claim 1 wherein the input stage has a second transistor coupled to receive a second input signal at a gate terminal thereof, the second transistor having a source terminal coupled to the source terminal of the first transistor.

5. The signal amplifier of claim 4 further comprising a second output-stage resistance disposed within the second IC device and having (i) a first terminal coupled to a drain terminal of the second transistor via a second signaling line that extends between the first and second IC devices, and (ii) a second terminal coupled to the second supply voltage node, the first terminal of the second output-stage resistance constituting a second output of the signal amplifier.

6. The signal amplifier of claim 5 wherein:
   the first and second signaling lines constitute a differential signaling link between the first and second IC devices;
   the first and second input signals received at the gate terminals of the first and second transistors, respectively, constitute a differential input signal; and
   the first and second outputs at respective first terminals of the first and second output-stage resistances constitute a differential output of the signal amplifier.

7. The signal amplifier of claim 1 further comprising a bias resistance element disposed within the first IC device and coupled between the gate terminal of the first transistor and a bias voltage node.

8. The signal amplifier of claim 7 further comprising a capacitive element having a first terminal coupled to the gate terminal of the first transistor and a second terminal coupled to receive the first input signal.

9. The signal amplifier of claim 1 wherein the first and second ICs are disposed in first and second cryogenic temperature domains, with the first cryogenic temperature domain being substantially colder than the second cryogenic temperature domain.

10. The signal amplifier of claim 1 wherein power consumption within the current-source and the first output-stage resistance is collectively more than twice the power consumed within the first transistor such that power consumption within the signal amplifier occurs predominantly within the second IC device.

11. The signal amplifier of claim 1 wherein the first output-stage resistance nominally matches an impedance of the first signaling line to effect a termination of the first signaling line.

12. A method of operation within a signal amplifier distributed between first and second integrated-circuit (IC) devices, the method comprising:
   receiving a first input signal at a gate terminal of a first transistor disposed within the first IC device, the first transistor forming at least part of an input stage of the signal amplifier;
   effecting a bias current within the signal amplifier via a current source disposed within the second IC device and coupled between a first supply voltage node and a source terminal of the first transistor; and
   generating a first amplified signal output at a first terminal of a first output-stage resistance disposed within the second IC device, the first terminal of the first output-stage resistance being coupled to a drain terminal of the first transistor via a first signaling line that extends between the first and second IC devices, and a second terminal of the first output-stage resistance being coupled to a second supply voltage node.

13. The method of claim 12 wherein the first transistor is a metal oxide semiconductor (MOS) transistor.

14. The method of claim 12 wherein receiving the first input signal at the gate terminal of the first transistor comprises receiving the first input signal from a rapid single flux quantum (RSFQ) circuit.

15. The method of claim 12 further comprising receiving a second input signal at a gate terminal of a second transistor disposed within the first IC device, the second transistor having a source terminal coupled to the source terminal of the first transistor and forming an additional part of the input stage of the signal amplifier.

16. The method of claim 15 further comprising generating a second amplified signal output at a first terminal of a second output-stage resistance disposed within the second IC device, the first terminal of the second output-stage resistance being coupled to a drain terminal of the second transistor via a second signaling line that extends between the first and second IC devices, and a second terminal of the second output-stage resistance being coupled to the second terminal of the first output-stage resistance.

17. The method of claim 16 wherein:
the first and second signaling lines constitute a differential signaling link between the first and second IC devices;
receiving the first and second input signals at the gate terminals of the first and second transistors, respectively, comprises receiving a differential input signal at the input stage of the signal amplifier; and
generating the first and second amplified output signals at respective first terminals of the first and second output-stage resistances comprises generating a differential output of the signal amplifier.

18. The method of claim 12 further comprising biasing the gate terminal of the first transistor via a bias resistance element disposed within the first IC device and coupled between the gate terminal of the first transistor and a bias voltage node.

19. The method of claim 18 wherein receiving the first input signal at the gate terminal of the first transistor comprises receiving the first input signal via a capacitive element having a first terminal coupled to the gate terminal of the first transistor and a second terminal coupled to receive the first input signal.

20. The method of claim 12 wherein the first and second ICs are disposed in first and second cryogenic temperature domains, with the first cryogenic temperature domain being substantially colder than the second cryogenic temperature domain and wherein power consumption within the current-source and the first output-stage resistance is collectively more than twice the power consumed within the first transistor such that power consumption within the signal amplifier occurs predominantly within the second IC device.

21. A signal amplifier distributed between first and second integrated-circuit (IC) devices, the signal amplifier comprising:
means for receiving a first input signal at a gate terminal of a first transistor disposed within the first IC device, the first transistor forming at least part of an input stage of the signal amplifier;
means disposed within the second IC device for effecting a bias current within the signal amplifier and coupled between a first supply voltage node and a source terminal of the first transistor; and
means for generating a first amplified signal output at a first terminal of a first output-stage resistance disposed within the second IC device, the first terminal of the first output-stage resistance being coupled to a drain terminal of the first transistor via a first signaling line that extends between the first and second IC devices, and a second terminal of the first output-stage resistance being coupled to a second supply voltage node.

* * * * *